(12) United States Patent
Kim et al.

(10) Patent No.: US 11,735,271 B2
(45) Date of Patent: Aug. 22, 2023

(54) MEMORY DEVICE AND METHOD OF OPERATING THE MEMORY DEVICE

(71) Applicant: SK hynix Inc., Icheon-si (KR)

(72) Inventors: Jong Wook Kim, Icheon-si (KR); Noh Yong Park, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 118 days.

(21) Appl. No.: 17/372,028

(22) Filed: Jul. 9, 2021

(65) Prior Publication Data

US 2022/0238163 A1    Jul. 28, 2022

(30) Foreign Application Priority Data

Jan. 25, 2021   (KR) .......................... 10-2021-0010376

(51) Int. Cl.
| | |
|---|---|
| *G11C 16/14* | (2006.01) |
| *G11C 11/00* | (2006.01) |
| *G11C 16/26* | (2006.01) |
| *G11C 16/24* | (2006.01) |
| *G11C 16/08* | (2006.01) |
| *G11C 16/04* | (2006.01) |

(52) U.S. Cl.
CPC .......... *G11C 16/26* (2013.01); *G11C 16/0483* (2013.01); *G11C 16/08* (2013.01); *G11C 16/24* (2013.01)

(58) Field of Classification Search
CPC ..... G11C 16/26; G11C 16/0483; G11C 16/08; G11C 16/24; G11C 5/147; G11C 7/18; G11C 8/14; G11C 16/34; G11C 16/30; G06F 3/0656; G06F 12/0882; G06F 13/1673

See application file for complete search history.

(56) References Cited

U.S. PATENT DOCUMENTS

| | | | |
|---|---|---|---|
| 2011/0085385 A1* | 4/2011 | Park ..................... | G11C 11/5621 365/185.2 |
| 2019/0295671 A1* | 9/2019 | Bang ...................... | G11C 16/26 |
| 2020/0211650 A1* | 7/2020 | Lee ....................... | G11C 16/3427 |
| 2020/0411100 A1* | 12/2020 | Kamae ................... | G06F 3/064 |
| 2021/0375378 A1* | 12/2021 | Choi ....................... | G11C 16/30 |
| 2022/0139461 A1* | 5/2022 | Choi ................... | G11C 16/0483 365/185.12 |

FOREIGN PATENT DOCUMENTS

| | | |
|---|---|---|
| KR | 1020190102431 A | 9/2019 |
| KR | 102058664 B1 | 12/2019 |

* cited by examiner

*Primary Examiner* — Hien N Nguyen
(74) *Attorney, Agent, or Firm* — William Park & Associates Ltd.

(57) ABSTRACT

The present technology relates to a memory device and a method of operating the memory device. The memory device includes a memory block including a plurality of memory cells, and a peripheral circuit configured to perform a read operation and a dummy read operation on the memory block. A discharge slope of a pass voltage applied to the memory block during the read operation is greater than a discharge slope of a dummy pass voltage applied to the memory block during the dummy read operation.

17 Claims, 10 Drawing Sheets

MEMORY DEVICE AND METHOD OF OPERATING THE MEMORY DEVICE

CROSS-REFERENCE TO RELATED APPLICATION

The present application claims priority under 35 U.S.C. § 119(a) to Korean patent application number 10-2021-0010376 filed on Jan. 25, 2021, in the Korean Intellectual Property Office, the entire disclosure of which is incorporated by reference herein.

BACKGROUND

1. Technical Field

The present disclosure relates to an electronic device, and more particularly, to a memory device and a method of operating the memory device.

2. Related Art

Recently, a paradigm for a computer environment has been transformed into ubiquitous computing, which enables a computer system to be used whenever and wherever. Therefore, a use of a portable electronic device such as a mobile phone, a digital camera, and a notebook computer is rapidly increasing. Such a portable electronic device generally uses a memory system that uses a memory device, that is, a data storage device. The data storage device is used as a main storage device or an auxiliary storage device of the portable electronic device.

The data storage device using the memory device has advantages that stability and durability are excellent because there is no mechanical driver, an access speed of information is very fast, and power consumption is low. As an example of the memory system having such advantages, a data storage device includes a universal serial bus (USB) memory device, a memory card having various interfaces, a solid state drive (SSD), and the like.

A memory device is largely divided into a volatile memory device and a nonvolatile memory device.

A write speed and a read speed of the nonvolatile memory device are relatively slow, however, the nonvolatile memory device maintains storage data even though power supply is shut off. Therefore, a nonvolatile memory device is used to store data to be maintained regardless of power supply. A nonvolatile memory device includes a read only memory (ROM), a mask ROM (MROM), a programmable ROM (PROM), an erasable programmable ROM (EPROM), an electrically erasable programmable ROM (EEPROM), a flash memory, a phase change random access memory (PRAM), a magnetic RAM (MRAM), a resistive RAM (RRAM), a ferroelectric RAM (FRAM), and the like. The flash memory is divided into a NOR type and a NAND type.

SUMMARY

According to an embodiment of the present disclosure, a memory device may include a memory block including a plurality of memory cells, and a peripheral circuit configured to perform a read operation and a dummy read operation on the memory block. A discharge slope of a pass voltage applied to the memory block during the read operation is greater than a discharge slope of a dummy pass voltage applied to the memory block during the dummy read operation.

According to an embodiment of the present disclosure, a memory device may include a memory block including a plurality of memory cells, a peripheral circuit configured to perform a read operation and a dummy read operation on the memory block, and a control logic circuit to control the peripheral circuit to perform the read operation and the dummy read operation. The control logic circuit controls the peripheral circuit to set a discharge slope of a dummy pass voltage applied to the memory block during the dummy read operation to be less than a discharge slope of a pass voltage applied to the memory block during the read operation, and to discharge the dummy pass voltage after applying the dummy pass voltage to the memory block during the dummy read operation based on the set slope.

According to an embodiment of the present disclosure, a method of operating a memory device may include performing a read operation on a selected memory block, and performing a dummy read operation on the selected memory block. The dummy read operation may discharge a dummy pass voltage at a first slope after applying the dummy pass voltage to the selected memory block, and the first slope is less than a discharge slope of a pass voltage applied to the memory block during the read operation.

DETAILED DESCRIPTION

Specific structural or functional descriptions of embodiments according to the concept which are disclosed in the present specification or application are illustrated only to describe the embodiments according to the concept of the present disclosure. The embodiments according to the concept of the present disclosure may be carried out in various forms and should not be construed as being limited to the embodiments described in the present specification or application.

Hereinafter, embodiments of the present disclosure will be described with reference to the accompanying drawings in order to describe in detail enough to allow those of ordinary skill in the art to easily implement the technical idea of the present disclosure.

An embodiment of the present disclosure may provide for a memory device capable of improving read performance by reducing stress on memory cells by performing a dummy read operation after a read operation, and a method of operating the memory device.

According to the present technology, after performing a read operation, a dummy read operation may be performed in an idle period of a memory device to suppress a negatively boosted channel potential to alleviate read stress. Accordingly, read performance of the memory device may be improved.

Figure 1:
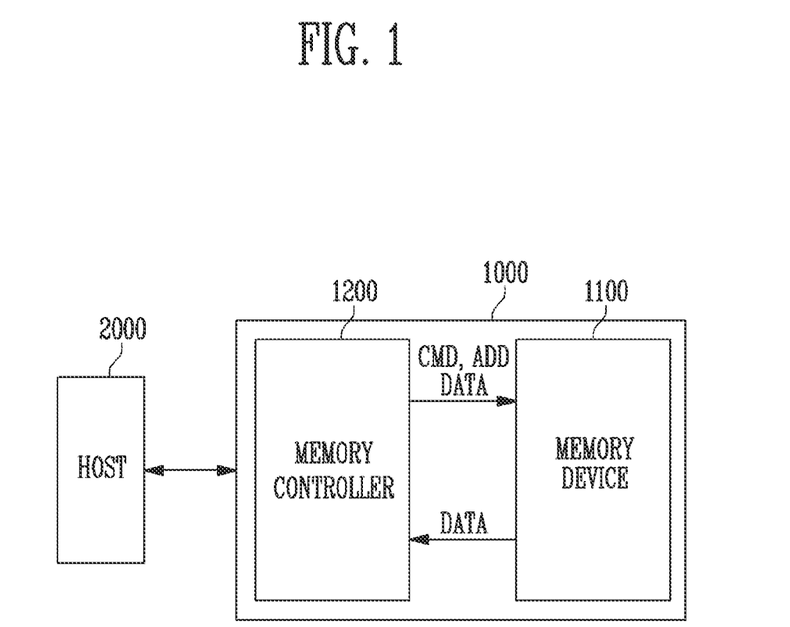
FIG. 1 is a diagram illustrating a memory system according to an embodiment of the present disclosure.

FIG. 1 is a diagram illustrating a memory system according to an embodiment of the present disclosure.

Referring to FIG. 1, the memory system 1000 includes a memory device 1100 in which data is stored, and a memory controller 1200 that controls the memory device 1100 under control of a host 2000.

The host 2000 may communicate with the memory system 1000 by using an interface protocol such as a peripheral component interconnect-express (PCI-E), an advanced technology attachment (ATA), a serial ATA (SATA), a parallel ATA (PATA), or a serial attached SCSI (SAS). In addition, the interface protocol between the host 2000 and the memory system 1000 is not limited to the above-described example, and may be one of other interface protocols such as a universal serial bus (USB), a multi-media card (MMC), an enhanced small disk interface (ESDI), and integrated drive electronics (IDE).

The memory controller 1200 may generally control an operation of the memory system 1000 and control a data exchange between the host 2000 and the memory device 1100. For example, the memory controller 1200 may control the memory device 1100 according to a request of the host 2000 to program or read data. The memory controller 1200 transmits a command CMD, an address ADD, and data DATA to be programmed to the memory device 1100 during a program operation. In addition, the memory controller 1200 may receive and temporarily store the data DATA read from the memory device 1100 during a read operation, and transmit the temporarily stored data DATA to the host 2000.

The memory device 1100 may perform a program, read, or erase operation under control of the memory controller 1200.

According to an embodiment, the memory device 1100 may include a double data rate synchronous dynamic random access memory (DDR SDRAM), a low power double data rate4 (LPDDR4) SDRAM, a graphics double data rate (GDDR) SDRAM, a low power DDR (LPDDR) SDRAM, a Rambus dynamic random access memory (RDRAM), or a flash memory.

Figure 2:
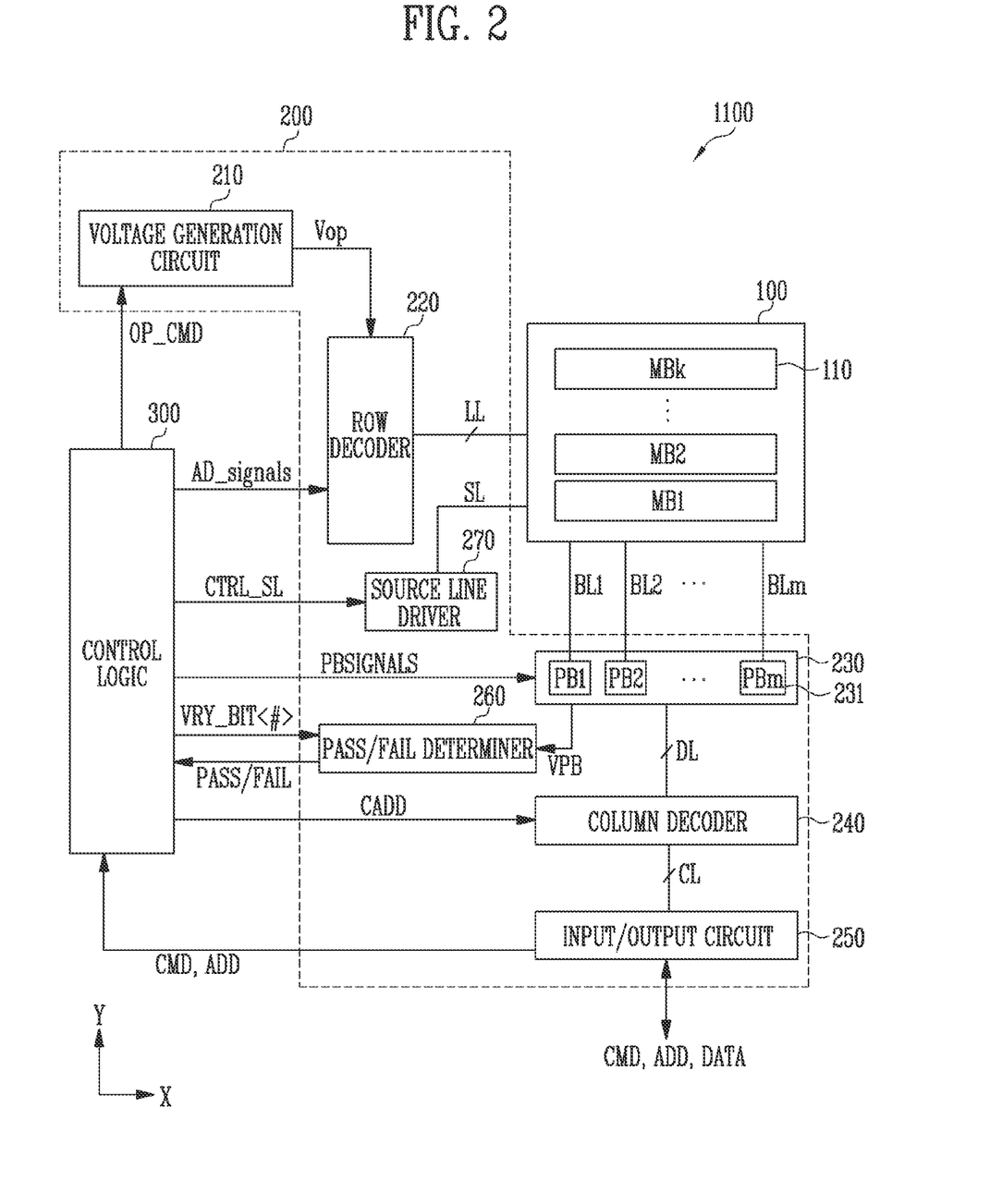
FIG. 2 is a diagram illustrating a memory device of FIG. 1.

FIG. 2 is a diagram illustrating the memory device of FIG. 1.

Referring to FIG. 2, the memory device 1100 may include a memory cell array 100 in which data is stored. The memory device 1100 may include a peripheral circuit 200 configured to perform a program operation for storing data in the memory cell array 100, a read operation for outputting the stored data, and an erase operation for erasing the stored data. The memory device 1100 may include control logic 300 that controls the peripheral circuit 200 according to the control of the memory controller 1200 of FIG. 1. The control logic 300 may be implemented as hardware, software, or a combination of hardware and software. For example, the control logic 300 may be a control logic circuit operating in accordance with an algorithm and/or a processor executing control logic code.

The memory device 1100 according to an embodiment of the present disclosure may perform a dummy read operation in an idle period, after performing the read operation. For example, the idle period may be a period in which the memory device does not perform any operation or a period after a read operation, a write operation, or an erase operation. The dummy read operation may be an operation for alleviating read stress of the memory cells in which the read operation is performed. The dummy read operation may be performed by applying a pass voltage to the memory cells and performing a discharge operation of the pass voltage during a time longer than that of the read operation, to suppress a phenomenon in which a channel is negatively boosted. In addition, during the discharge operation of the pass voltage, a positive voltage may be applied to a bit line or a source line.

The memory cell array 100 may include a plurality of memory blocks MB1 to MBk; 110 (k is a positive integer). Local lines LL and bit lines BL1 to BLm (m is a positive integer) may be connected to each of the memory blocks MB1 to MBk; 110. For example, the local lines LL may include a first select line, a second select line, and a plurality of word lines arranged between the first and second select lines. In addition, the local lines LL may include dummy lines arranged between the first select line and the word lines, and between the second select line and the word lines. Here, the first select line may be a source select line, and the second select line may be a drain select line. For example, the local lines LL may include the word lines, the drain and source select lines, and source lines SL. For example, the local lines LL may further include the dummy lines. For example, the local lines LL may further include pipe lines. The local lines LL may be connected to the memory blocks MB1 to MBk; 110, respectively, and the bit lines BL1 to BLm may be commonly connected to the memory blocks MB1 to MBk; 110. The memory blocks MB1 to MBk; 110 may be implemented in a two-dimensional or three-dimensional structure. For example, the memory cells may be arranged in a direction parallel to a substrate in the memory block 110 of the two-dimensional structure. For example, the memory cells may be stacked in a direction perpendicular to the substrate in the memory block 110 of the three-dimensional structure.

The peripheral circuit 200 may be configured to perform the program, read, and erase operations of the selected memory block 110 under control of the control logic 300. For example, the peripheral circuit 200 may include a voltage generation circuit 210, a row decoder 220, a page buffer group 230, a column decoder 240, an input/output circuit 250, a pass/fail determiner (pass/fail check circuit) 260, and a source line driver 270.

The voltage generation circuit 210 may generate various operation voltages Vop used in the program, read, and erase operations in response to an operation signal OP_CMD. In addition, the voltage generation circuit 210 may selectively discharge the local lines LL in response to the operation signal OP_CMD. For example, the voltage generation circuit 210 may generate a program voltage, a verify voltage, a read voltage, a pass voltage, a plurality of set voltages, and the like under the control of the control logic 300.

The voltage generation circuit 210 may generate a dummy read voltage and a dummy pass voltage during the dummy read operation in response to the operation signal OP_CMD, and adjust a slope of the dummy pass voltage discharged during a discharge operation of the dummy pass voltage. For example, during the dummy read operation, a discharge slope of the dummy pass voltage may be less than a discharge slope of the pass voltage during the read operation. That is, a discharge time of the dummy pass voltage during the dummy read operation may be longer than a discharge time of the pass voltage during the read operation. The voltage generation circuit 210 may discharge the dummy pass voltage at a relatively gentle slope during the dummy read operation.

A potential of the pass voltage generated during the read operation and a potential of the dummy pass voltage generated during the dummy read operation may be the same.

The row decoder 220 may transfer the operation voltages Vop to the local lines LL connected to the selected memory block 110 in response to row decoder control signals AD_signals. For example, during the program operation, the row decoder 220 may apply the program voltage generated by the voltage generation circuit 210 to a selected word line among the local lines LL, and apply the pass voltage generated by the voltage generation circuit 210 to unselected word lines, in response to the row decoder control signals AD_signals. In addition, during the read operation, the row decoder 220 may sequentially apply a plurality of read voltages generated by the voltage generation circuit 210 to the selected word line among the local lines LL, and apply the pass voltage generated by the voltage generation circuit 210 to the unselected word lines, in response to the row decoder control signals AD_signals. In addition, during the dummy read operation, the row decoder 220 may apply the dummy pass voltage and the dummy read voltage generated by the voltage generation circuit 210 to the word lines among the local lines LL in response to the row decoder control signals AD_signals.

The page buffer group 230 may include a plurality of page buffers PB1 to PBm; 231 connected to the bit lines BL1 to BLm. The page buffers PB1 to PBm; 231 may operate in response to page buffer control signals PBSIGNALS. For example, during the program operation, the page buffers PB1 to PBm; 231 may temporarily store data to be programmed and adjust a potential level of the bit lines BL1 to BLm based on the temporarily stored data to be programmed. In addition, during the read operation or a program verify operation, the page buffers PB1 to PBm; 231 may sense a voltage or a current of the bit lines BL1 to BLm. In addition, during the dummy read operation, the page buffers PB1 to PBm; 231 may apply the positive set voltage to the bit lines BL1 to BLm.

The column decoder 240 may transfer data between the input/output circuit 250 and the page buffer group 230 in response to a column address CADD. For example, the column decoder 240 may exchange data with the page buffers 231 through data lines DL, or may exchange data with the input/output circuit 250 through column lines CL.

The input/output circuit 250 may transfer the command CMD and the address ADD received from the memory controller 1200 of FIG. 1 to the control logic 300 or may exchange the data DATA with the column decoder 240.

The pass/fail determiner 260 may generate a reference current in response to a permission bit VRY_BIT<#> during the read operation or the verify operation, compare a sensing voltage VPB received from the page buffer group 230 with a reference voltage generated by the reference current, and output a pass signal PASS or a fail signal FAIL. The sensing voltage VPB may be a voltage controlled based on the number of memory cells determined as a pass during a program verify operation.

The source line driver 270 may be connected to the memory cell included in the memory cell array 100 through the source line SL and may control a voltage applied to the source line SL. The source line driver 270 may receive a source line control signal CTRL_SL from the control logic 300 and may control a voltage applied to the source line SL based on the source line control signal CTRL_SL. The source line driver 270 may apply the positive set voltage to the source line SL during the dummy read operation.

The control logic 300 may output the operation signal OP_CMD, the row decoder control signals AD_signals, the page buffer control signals PBSIGNALS, and the permission bit VRY_BIT<#> in response to the command CMD and the address ADD to control the peripheral circuit 200.

The control logic 300 may control the peripheral circuit 200 to perform the dummy read operation in the idle period of the memory device 1100 after the read operation on the selected memory block is completed. For example, when the memory device 1100 enters the idle period after the read operation on the selected memory block is completed, the control logic 300 may control the peripheral circuit 200 to apply the pass voltage to the selected memory block and then discharge the dummy pass voltage at a set discharge slope and during a set discharge time. For example, the set discharge slope may be less than the discharge slope of the pass voltage during the read operation, and the set discharge time may be longer than the discharge time of the pass voltage during the read operation. Accordingly, negative boosting of the channel in the selected memory block may be suppressed during the dummy read operation, and thus read stress may be alleviated.

Figure 3:
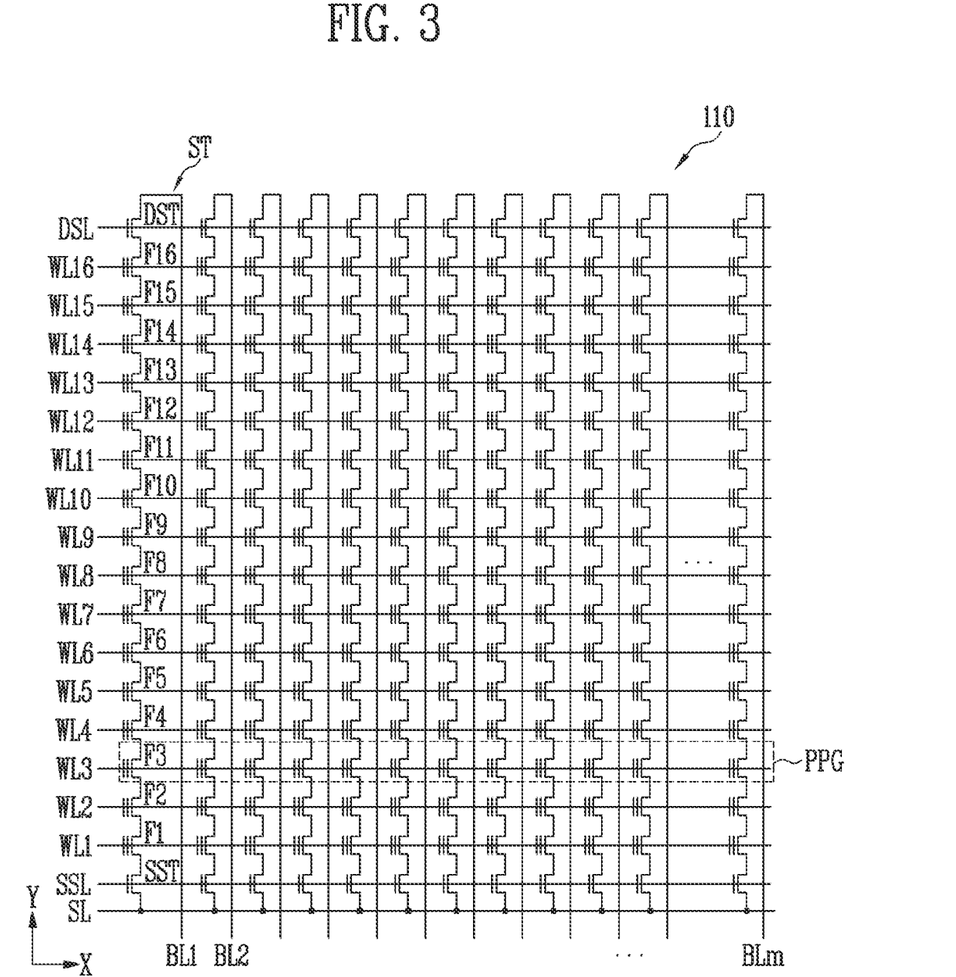
FIG. 3 is a diagram illustrating a memory block of FIG. 2.

FIG. 3 is a diagram illustrating the memory block of FIG. 2.

Referring to FIG. 3, the memory block 110 may be connected to a plurality of word lines arranged in parallel with each other between the first select line and the second select line. Here, the first select line may be the source select line SSL, and the second select line may be the drain select line DSL. For example, the memory block 110 may include a plurality of strings ST connected between the bit lines BL1 to BLm and the source line SL. The bit lines BL1 to BLm may be connected to the strings ST, respectively, and the source line SL may be commonly connected to the strings ST. Since the strings ST may be configured to be identical to each other, a string ST connected to the first bit line BL1 will be specifically described, as an example.

The string ST may include a source select transistor SST, a plurality of memory cells F1 to F16, and a drain select transistor DST connected in series between the source line SL and the first bit line BL1. One string ST may include at least one or more of the source select transistor SST and the drain select transistor DST, and may include the memory cells F1 to F16 more than the number shown in the figure.

A source of the source select transistor SST may be connected to the source line SL and a drain of the drain select transistor DST may be connected to the first bit line BL1. The memory cells F1 to F16 may be connected in series between the source select transistor SST and the drain select transistor DST. Gates of the source select transistors SST included in the different strings ST may be connected to the source select line SSL, gates of the drain select transistors DST may be connected to the drain select line DSL, and gates of the memory cells F1 to F16 may be connected to the plurality of word lines WL1 to WL16. A group of the memory cells connected to the same word line among the memory cells included in different strings ST may be referred to as a page PPG. Therefore, the memory block 11 may include the pages PPG of the number of the word lines WL1 to WL16.

Figure 4:
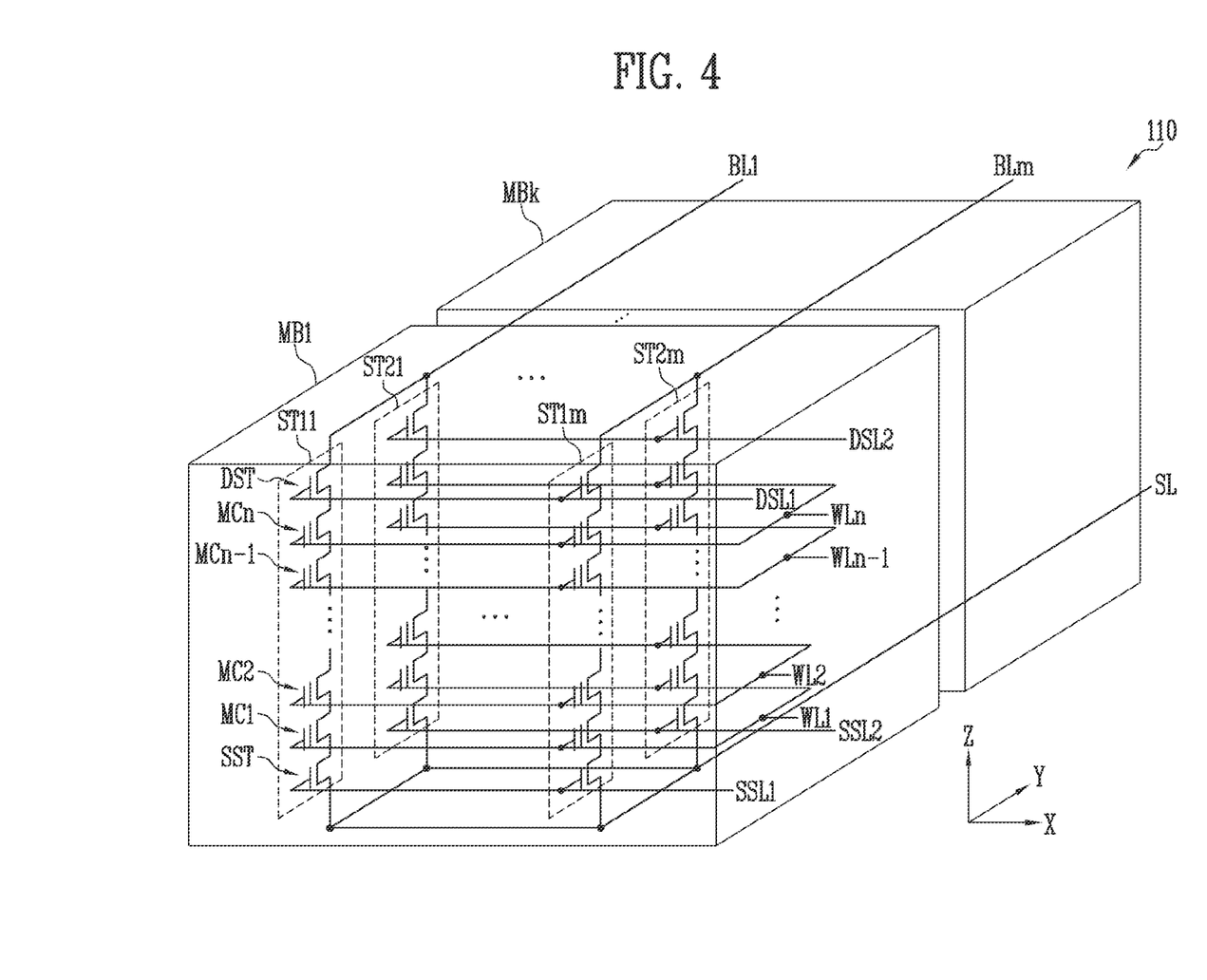
FIG. 4 is a diagram illustrating an embodiment of a memory block configured in a three-dimension.

FIG. 4 is a diagram illustrating an embodiment of a memory block configured in a three-dimension.

Referring to FIG. 4, the memory cell array 100 may include a plurality of memory blocks MB1 to MBk; 110. The memory block 110 may include a plurality of strings ST11 to ST1m and ST21 to ST2m. As an embodiment, each of the plurality of strings ST11 to STim and ST21 to ST2m may be formed in an 'I' shape or a 'U' shape. In the first memory block MB1, m strings may be arranged in a row direction (X direction). In FIG. 4, two strings are arranged in a column direction (Y direction), but this is for convenience of description, and three or more strings may be arranged in the column direction (Y direction).

Each of the plurality of strings ST11 to STim and ST21 to ST2m to ST2m may include at least one source select transistor SST, first to n-th memory cells MC1 to MCn, and at least one drain select transistor DST.

The source select transistor SST of each string may be connected between the source line SL and the memory cells MC1 to MCn. The source select transistors of the strings arranged in the same row may be connected to the same source select line. The source select transistors of the strings ST11 to ST1m arranged in the first row may be connected to a first source select line SSL1. The source select transistors of the strings ST21 to ST2m arranged in the second row may be connected to a second source select line SSL2. As another embodiment, the source select transistors of the strings ST11 to STim and ST21 to ST2m may be commonly connected to one source select line.

The first to n-th memory cells MC1 to MCn of each string may be connected to each other in series between the source select transistor SST and the drain select transistor DST. Gates of the first to n-th memory cells MC1 to MCn may be connected to the first to n-th word lines WL1 to WLn, respectively.

As an embodiment, at least one of the first to n-th memory cells MC1 to MCn may be used as a dummy memory cell. When the dummy memory cell is provided, a voltage or a current of a corresponding string may be stably controlled. Therefore, reliability of the data stored in the memory block 110 may be improved.

The drain select transistor DST of each string may be connected between the bit line and the memory cells MC1 to MCn. The drain select transistors DST of the strings arranged in the row direction may be connected to the drain select line extending in the row direction. The drain select transistors DST of the strings ST11 to STim of the first row may be connected to a first drain select line DSL1. The drain select transistors DST of the strings ST21 to ST2m of the second row may be connected to a second drain select line DSL2.

Figure 5:
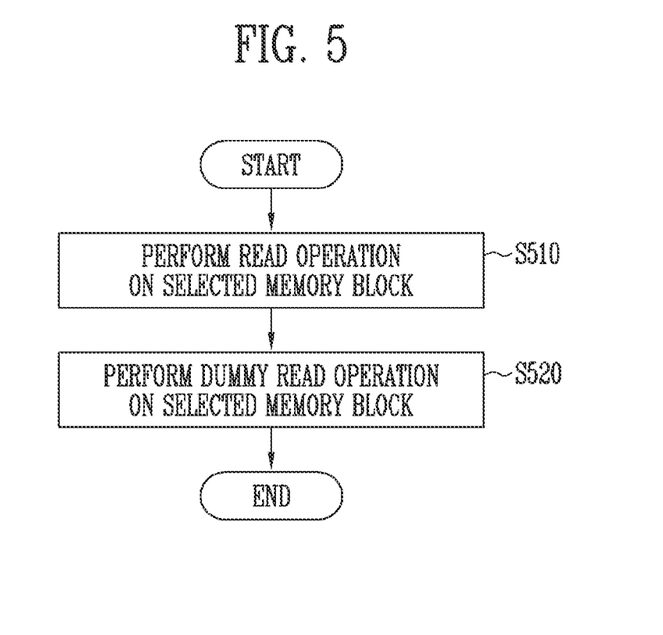
FIG. 5 is a flowchart illustrating a method of operating a memory device according to an embodiment of the present disclosure.

FIG. 5 is a flowchart illustrating a method of operating a memory device according to an embodiment of the present disclosure.

The method of operating the memory device according to an embodiment of the present disclosure is described with reference to FIGS. 2 to 5 as follows.

In step S510, the read operation on the selected memory block (for example, MB1) is performed. For example, the voltage generation circuit 210 generates and outputs the read voltage and the pass voltage, and the row decoder 220 applies the read voltage to the selected word line (for example, WL1) of the selected memory block MB1 and applies the pass voltage to the unselected word lines (for example, WL2 to WLn).

The page buffers PB1 to PBm of the page buffer group 230 precharge the bit lines BL1 to BLm to a set level, and then sense the voltage or the current of the bit lines BL1 to BLm to perform the read operation.

After the read operation is completed, the voltage generation circuit 210 discharges the pass voltage applied to the unselected word lines (for example, WL2 to WLn) to a ground voltage level in the pass voltage discharge period. For example, the discharge slope of the pass voltage has a first value, and the pass voltage is discharged from a pass voltage level to the ground voltage level during a first discharge time.

In step S520, when the memory device 1100 enters the idle period after the read operation of the selected memory block MB1 is completed, the dummy read operation on the selected memory block MB1 is performed.

For example, the voltage generation circuit 210 generates and outputs the dummy read voltage and the dummy pass voltage, and the row decoder 220 applies the dummy read voltage to the selected word line (for example, WL1) of the selected memory block MB1 and applies the dummy pass voltage to the unselected word lines (for example, WL2 to WLn). In an embodiment of the present disclosure, the dummy read voltage is generated and is applied to the selected word line, but only the dummy pass voltage may be generated and applied to all word lines WL1 to WLn without a dummy read voltage generating operation. The dummy pass voltage may be the same voltage as the pass voltage generated during the read operation.

Thereafter, the voltage generation circuit 210 discharges the dummy pass voltage applied to the unselected word lines (for example, WL2 to WLn) to the ground voltage level in the dummy pass voltage discharge period. For example, the discharge slope of the dummy pass voltage has a second value, and the dummy pass voltage is discharged from the pass voltage level to the ground voltage level during a second discharge time. The discharge slope of the dummy pass voltage is less than the discharge slope of the pass voltage during the read operation, and the discharge time of the dummy pass voltage may be longer than the discharge time of the pass voltage during the read operation.

In the discharge period of the dummy pass voltage described above, the page buffers PB1 to PBm of the page buffer group 230 may apply a positive set voltage to the bit lines BL1 to BLm. In addition, in the discharge period of the dummy pass voltage, the source line driver 270 may apply the positive set voltage to the source line SL of the selected memory block MB1.

Figure 6:
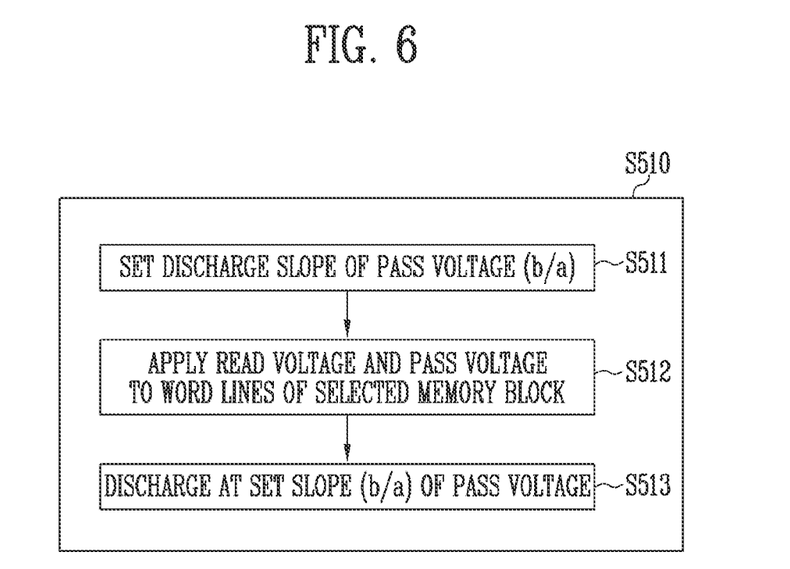
FIG. 6 is a flowchart illustrating a read operation of FIG. 5.

FIG. 6 is a flowchart illustrating a read operation of FIG. 5.

Figure 7:
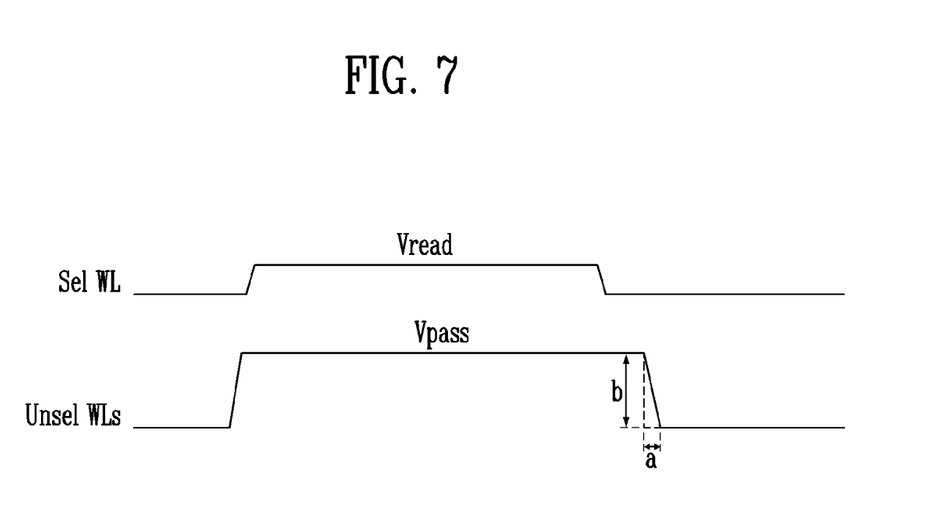
FIG. 7 is a waveform diagram of signals illustrating the read operation of FIG. 5.

FIG. 7 is a waveform diagram of signals illustrating the read operation of FIG. 5.

Step S510 is described with reference to FIGS. 2, 6 and 7 as follows.

In step S511, the control logic 300 sets the discharge slope of the pass voltage to a first value (b/a) during the read operation. For example, b is a potential level difference between the ground voltage and the pass voltage, and a is the discharge time.

In step S512, the voltage generation circuit 210 generates and outputs the read voltage Vread and the pass voltage Vpass, and the row decoder 220 applies the read voltage Vread to the selected word line Sel WL of the selected memory block MB1 and applies the pass voltage Vpass to unselected word lines Unsel WLs.

In step S513, the pass voltage Vpass is discharged at the set slope b/a. For example, the voltage generation circuit 210 discharges the pass voltage Vpass applied to the unselected word lines Unsel WLs to the ground voltage level in the pass voltage discharge period. The discharge slope of the pass voltage has the first value (b/a), and the pass voltage is discharged from the pass voltage level to the ground voltage level during the first discharge time a.

At this time, as the pass voltage Vpass is gradually discharged, the memory cells included in the selected memory block MB1 may be sequentially turned off from memory cells programmed with a high threshold voltage, and channels of the turned off memory cells and a plurality of strings included in the selected memory block MB1 may be boosted to a negative state lower than the ground voltage level by the rapidly discharged pass voltage Vpass.

Figure 8:
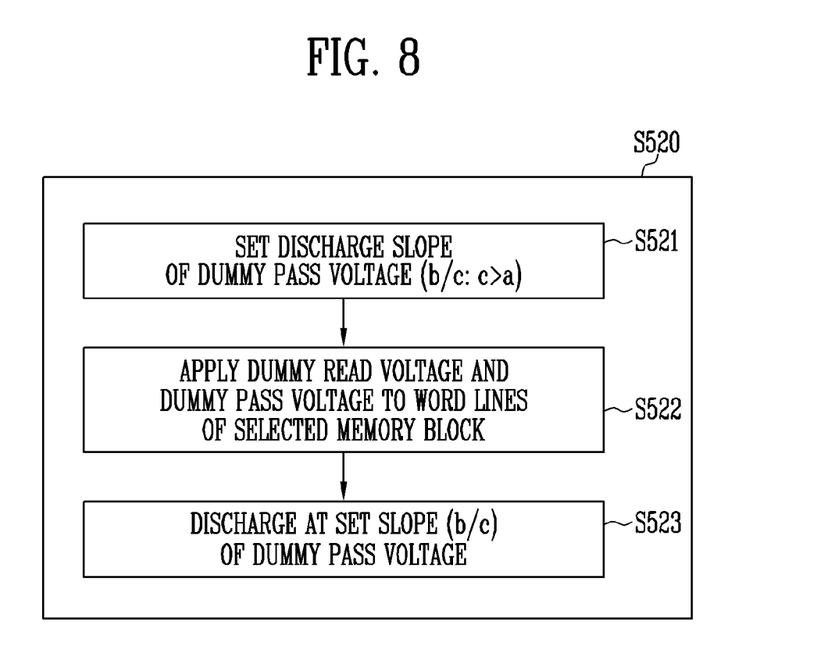
FIG. 8 is a flowchart illustrating a dummy read operation of FIG. 5.

FIG. 8 is a flowchart illustrating a dummy read operation of FIG. 5.

Figure 9:
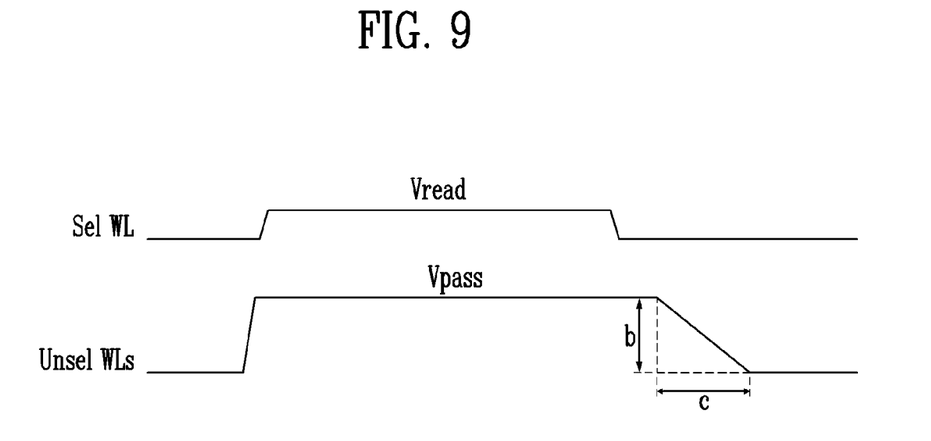
FIG. 9 is a waveform diagram of signals illustrating the dummy read operation of FIG. 5.

FIG. 9 is a waveform diagram of signals illustrating the dummy read operation of FIG. 5.

S520 is described with reference to FIGS. 2, 8, and 9 as follows.

In step S521, the control logic 300 sets the discharge slope of the dummy pass voltage Vpass to a second value b/c during the dummy read operation. For example, b is a potential level difference between the ground voltage and the dummy pass voltage Vpass, and c is the discharge time. The discharge time c of the dummy pass voltage Vpass may be longer than the discharge time a of the pass voltage Vpass during the read operation. The dummy pass voltage Vpass and the pass voltage Vpass may have the same potential level. Accordingly, the discharge slope b/c of the dummy pass voltage Vpass during the dummy read operation is less than the discharge slope b/a of the pass voltage Vpass during the read operation.

In step S522, the voltage generation circuit 210 generates and outputs the dummy read voltage Vread and the dummy pass voltage Vpass, and the row decoder 220 applies the dummy read voltage Vread to the selected word line Sel WL of the selected memory block MB1 and applies the dummy pass voltage Vpass to the unselected word lines Unsel WLs.

In step S523, the dummy pass voltage Vpass is discharged at the set slope b/c. For example, the voltage generation circuit 210 discharges the dummy pass voltage Vpass applied to the unselected word lines Unsel WLs to the ground voltage level in the dummy pass voltage discharge period. The discharge slope of the dummy pass voltage has the second value (b/c), and the dummy pass voltage is discharged from the dummy pass voltage level to the ground voltage level during the second discharge time c.

Since the dummy pass voltage Vpass is discharged relatively slowly at a slope gentler or less than that of the pass voltage Vpass of the read operation, the channel of the plurality of strings included in the selected memory block MB1 may be prevented or mitigated from being boosted to a negative state.

Figure 10:
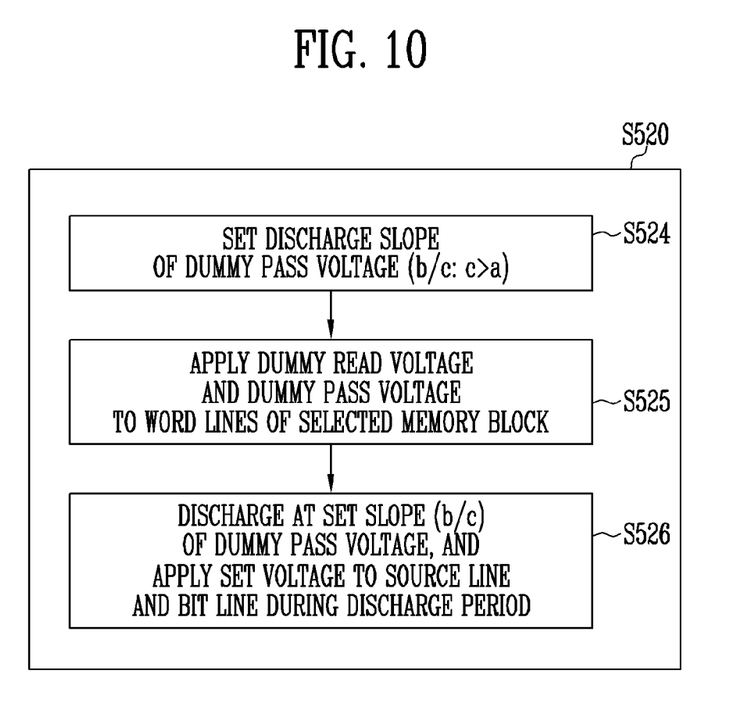
FIG. 10 is a flowchart illustrating another embodiment of the dummy read operation of FIG. 5.

FIG. 10 is a flowchart illustrating another embodiment of the dummy read operation of FIG. 5.

Figure 11:
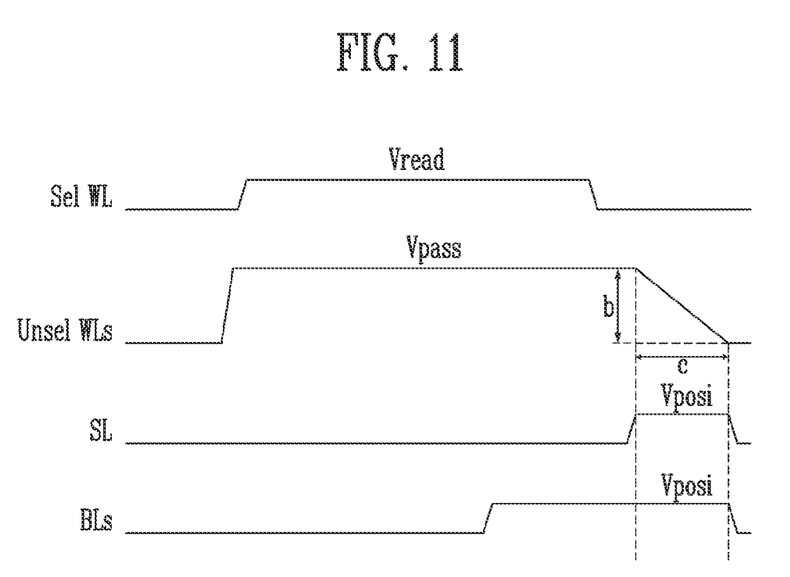
FIG. 11 is a waveform diagram of signals illustrating another embodiment of the dummy read operation of FIG. 5.

FIG. 11 is a waveform diagram of signals illustrating another embodiment of the dummy read operation of FIG. 5.

Another embodiment of step S520 is described with reference to FIGS. 2, 10 and 11 as follows.

In step S524, the control logic 300 sets the discharge slope of the dummy pass voltage Vpass to the second value b/c during the dummy read operation. For example, b is the potential level difference between the ground voltage and the dummy pass voltage Vpass, and c is the discharge time. The discharge time c of the dummy pass voltage Vpass may be longer than the discharge time a of the pass voltage Vpass during the read operation. The dummy pass voltage Vpass and the pass voltage Vpass may have the same potential level. Accordingly, the discharge slope b/c of the dummy pass voltage Vpass during the dummy read operation is less than the discharge slope b/a of the pass voltage Vpass during the read operation.

In step S525, the voltage generation circuit 210 generates and outputs the dummy read voltage Vread and the dummy pass voltage Vpass, and the row decoder 220 applies the dummy read voltage Vread to the selected word line Sel WL of the selected memory block MB1 and applies the dummy pass voltage Vpass to the unselected word lines Unsel WLs.

In step S526, the dummy pass voltage Vpass is discharged at the set slope b/c. For example, the voltage generation circuit 210 discharges the dummy pass voltage Vpass applied to the unselected word lines Unsel WLs to the ground voltage level in the dummy pass voltage discharge period. The discharge slope of the dummy pass voltage has the second value (b/c), and the dummy pass voltage is discharged from the dummy pass voltage level to the ground voltage level during the second discharge time c.

In addition, during the discharge operation of the dummy pass voltage Vpass, the page buffers PB1 to PBm of the page buffer group 230 may apply the positive set voltage Vposi to the bit lines BL1 to BLm, the source line driver 270 may apply the positive set voltage Vposi to the source line SL of the selected memory block MB1. Accordingly, the channel of the plurality of strings included in the selected memory block MB1 may be prevented or mitigated from being boosted to a negative state. In an embodiment, the positive set voltage Vposi may be applied to the bit lines BL1 to BLm during the discharge operation of the dummy pass voltage Vpass and at least a part of the duration whereby by the dummy pass voltage Vpass is applied to the unselected word lines Unsel WLs as shown in FIG. 11.

Figure 12:
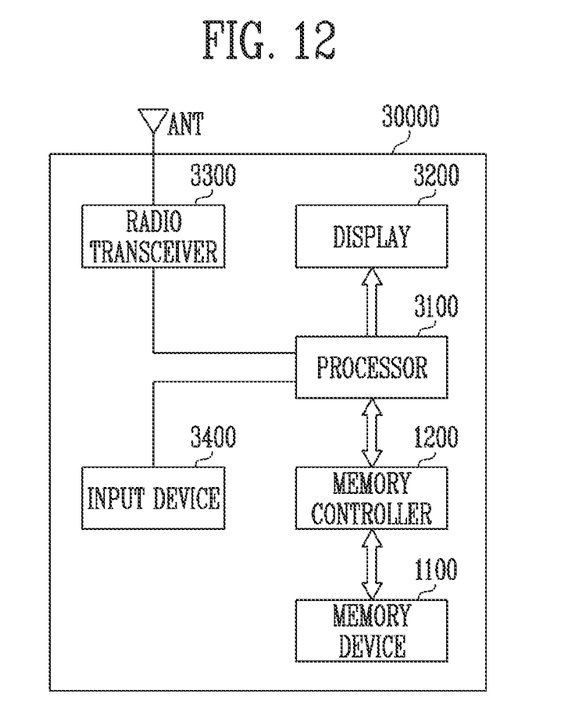
FIG. 12 is a diagram illustrating another embodiment of the memory system.

FIG. 12 is a diagram illustrating another embodiment of the memory system.

Referring to FIG. 12, the memory system 30000 may be implemented as a cellular phone, a smart phone, a tablet PC, a personal digital assistant (PDA) or a wireless communication device. The memory system 30000 may include the memory device 1100 and the memory controller 1200 capable of controlling the operation of the memory device 1100. The memory controller 1200 may control a data access operation, for example, a program operation, an erase operation, or a read operation, of the memory device 1100 under control of a processor 3100.

Data programmed in the memory device 1100 may be output through a display 3200 under the control of the memory controller 1200.

A radio transceiver 3300 may transmit and receive a radio signal through an antenna ANT. For example, the radio transceiver 3300 may convert a radio signal received through the antenna ANT into a signal that may be processed by the processor 3100. Therefore, the processor 3100 may process the signal output from the radio transceiver 3300 and transmit the processed signal to the memory controller 1200 or the display 3200. The memory controller 1200 may program the signal processed by the processor 3100 to the memory device 1100. In addition, the radio transceiver 3300 may convert a signal output from the processor 3100 into a radio signal, and output the converted radio signal to an external device through the antenna ANT. An input device 3400 may be a device capable of inputting a control signal for controlling the operation of the processor 3100 or data to be processed by the processor 3100. The input device 3400 may be implemented as a pointing device such as a touch pad or a computer mouse, a keypad, or a keyboard. The processor 3100 may control an operation of the display 3200 so that data output from the memory controller 1200, data output from the radio transceiver 3300, or data output from the input device 3400 is output through the display 3200.

According to an embodiment, the memory controller 1200 capable of controlling the operation of memory device 1100 may be implemented as a part of the processor 3100 and may also be implemented as a chip separate from the processor 3100. In addition, the memory controller 1200 may be implemented through an example of the memory controller 1200 shown in FIG. 1 and the memory device 1100 may be implemented through an example of the memory device 1100 shown in FIG. 2.

Figure 13:
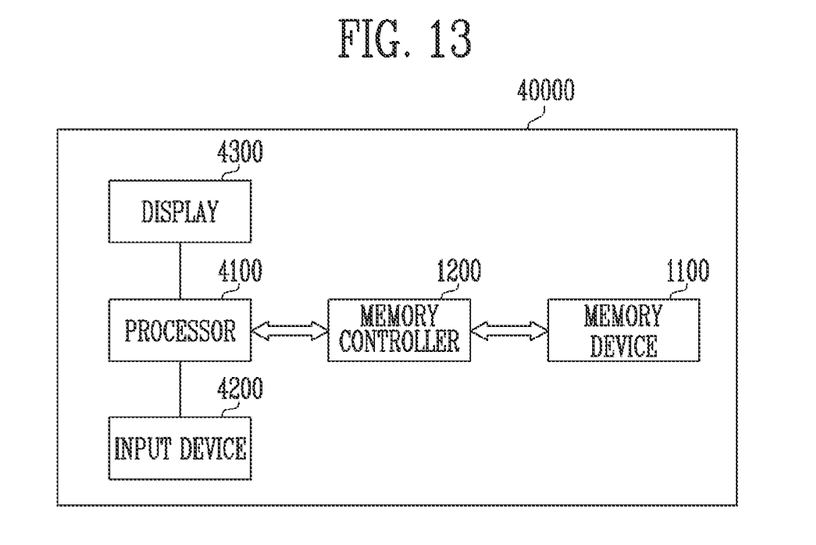
FIG. 13 is a diagram illustrating another embodiment of the memory system.

FIG. 13 is a diagram illustrating another embodiment of the memory system.

Referring to FIG. 13, the memory system 40000 may be implemented as a personal computer (PC), a tablet PC, a net-book, an e-reader, a personal digital assistant (PDA), a portable multimedia player (PMP), an MP3 player, or an MP4 player.

The memory system 40000 may include the memory device 1100 and the memory controller 1200 capable of controlling a data process operation of the memory device 1100.

A processor 4100 may output data stored in the memory device 1100 through a display 4300, according to data input through an input device 4200. For example, the input device 4200 may be implemented as a point device such as a touch pad or a computer mouse, a keypad, or a keyboard.

The processor 4100 may control the overall operation of the memory system 40000 and control the operation of the memory controller 1200. According to an embodiment, the memory controller 1200 capable of controlling the operation of memory device 1100 may be implemented as a part of the processor 4100 or may be implemented as a chip separate from the processor 4100. In addition, the memory controller 1200 may be implemented through an example of the memory controller 1200 shown in FIG. 1 and the memory device 1100 may be implemented through an example of the memory device 1100 shown in FIG. 2.

Figure 14:
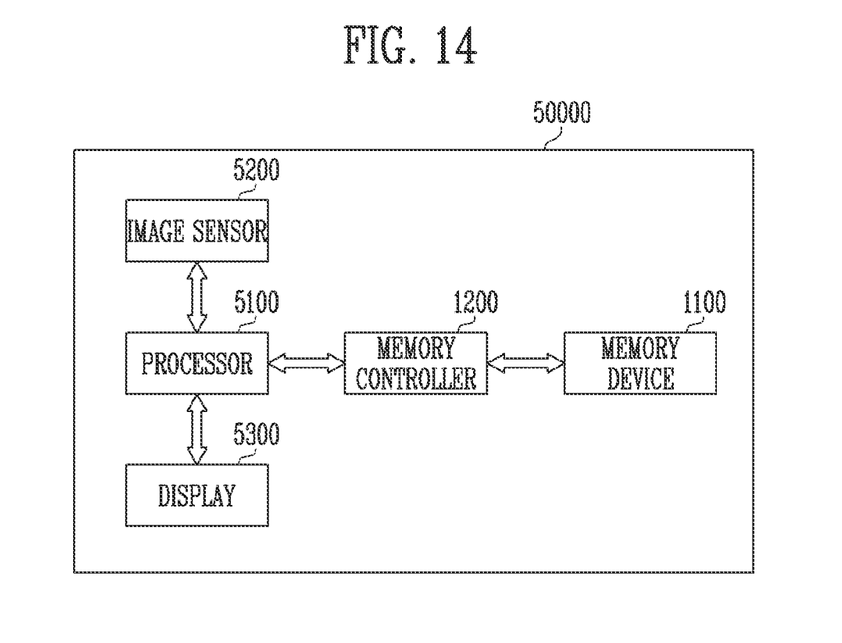
FIG. 14 is a diagram illustrating another embodiment of the memory system.

FIG. 14 is a diagram illustrating another embodiment of the memory system.

Referring to FIG. 14, the memory system 50000 may be implemented as an image processing device, for example, a digital camera, a portable phone provided with a digital camera, a smart phone provided with a digital camera, or a tablet PC provided with a digital camera.

The memory system 50000 includes the memory device 1100 and the memory controller 1200 capable of controlling a data process operation, for example, a program operation, an erase operation, or a read operation, of the memory device 1100.

An image sensor 5200 of the memory system 50000 may convert an optical image into digital signals. The converted digital signals may be transmitted to a processor 5100 or the memory controller 1200. Under control of the processor 5100, the converted digital signals may be output through a display 5300 or stored in the memory device 1100 through the memory controller 1200. In addition, data stored in the memory device 1100 may be output through the display 5300 under the control of the processor 5100 or the memory controller 1200.

According to an embodiment, the memory controller 1200 capable of controlling the operation of memory device 1100 may be implemented as a part of the processor 5100 or may be implemented as a chip separate from the processor 5100. In addition, the memory controller 1200 may be implemented through an example of the memory controller 1200 shown in FIG. 1 and the memory device 1100 may be implemented through an example of the memory device 1100 shown in FIG. 2.

Figure 15:
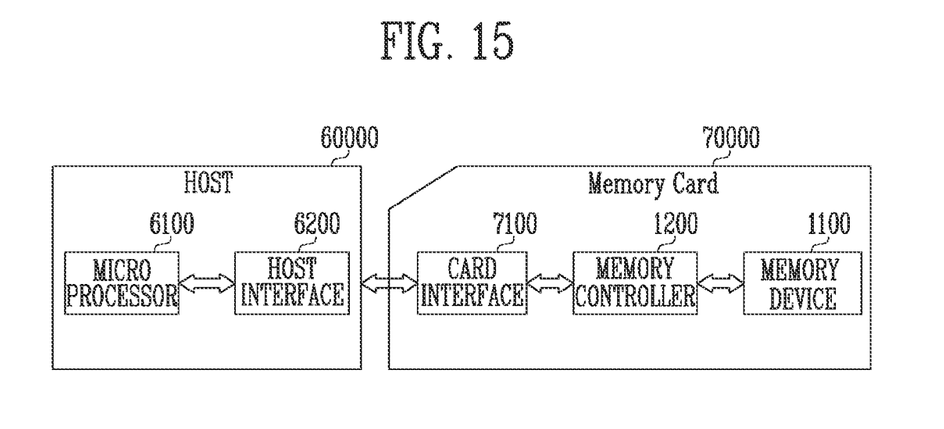
FIG. 15 is a diagram illustrating another embodiment of the memory system.

FIG. 15 is a diagram illustrating another embodiment of the memory system.

Referring to FIG. 15, the memory system 70000 may be implemented as a memory card or a smart card. The memory system 70000 may include the memory device 1100, the memory controller 1200, and a card interface 7100.

The memory controller 1200 may control data exchange between the memory device 1100 and the card interface 7100. According to an embodiment, the card interface 7100 may be a secure digital (SD) card interface or a multi-media card (MMC) interface, but is not limited thereto. In addition, the memory controller 1200 may be implemented through an example of the memory controller 1200 shown in FIG. 1 and the memory device 1100 may be implemented through an example of the memory device 1100 shown in FIG. 2.

The card interface 7100 may interface data exchange between a host 60000 and the memory controller 1200 according to a protocol of the host 60000. According to an embodiment, the card interface 7100 may support a universal serial bus (USB) protocol, and an interchip (IC)-USB protocol. Here, the card interface may refer to hardware capable of supporting a protocol that is used by the host 60000, software installed in the hardware, or a signal transmission method.

When the memory system 70000 is connected to a host interface 6200 of the host 60000 such as a PC, a tablet PC, a digital camera, a digital audio player, a mobile phone, a console video game hardware, or a digital set-top box, the interface 6200 may perform data communication with the memory device 1100 through the card interface 7100 and the memory controller 1200 under control of a microprocessor 6100.

In the embodiments described above, all steps may be selectively performed or omitted. In addition, steps in each embodiment need not occur in order, and may be reversed. Meanwhile, the embodiments of the present disclosure disclosed in the present specification and the drawings are merely specific examples for describing the technical content of the present specification and facilitating understanding of the present specification and do not limit the scope of the present specification. That is, it is apparent to those skilled in the art to which the present disclosure pertains that other modification examples based on the technical spirit of the present disclosure are possible.

What is claimed is:

1. A memory device comprising:
a memory block including a plurality of memory cells; and
a peripheral circuit configured to perform a read operation and a dummy read operation on the memory block,
wherein a discharge slope of a pass voltage applied to the memory block during the read operation is greater than a discharge slope of a dummy pass voltage applied to the memory block during the dummy read operation.

2. The memory device of claim 1, wherein the peripheral circuit applies a read voltage to a selected word line of the memory block, applies the pass voltage to unselected word lines during the read operation, and discharges the pass voltage at a first slope during a pass voltage discharge period of the read operation.

3. The memory device of claim 2, wherein the peripheral circuit applies the dummy pass voltage to the word lines of the memory block during the dummy read operation, and discharges the dummy pass voltage at a second slope less than the first slope during a dummy pass voltage discharge period of the dummy read operation.

4. The memory device of claim 3, wherein the peripheral circuit discharges the pass voltage from a pass voltage level to a ground voltage level during a first time in the pass voltage discharge period, and discharges the dummy pass voltage from a dummy pass voltage level to the ground voltage level during a second time longer than the first time in the dummy pass voltage discharge period.

5. The memory device of claim 3, wherein the peripheral circuit applies a positive set voltage to bit lines or a source line of the memory block in the dummy pass voltage discharge period.

6. The memory device of claim 1, wherein a potential level of the pass voltage and a potential level of the dummy pass voltage are the same.

7. The memory device of claim 1, wherein the peripheral circuit performs the dummy read operation in an idle period.

8. A memory device comprising:
a memory block including a plurality of memory cells;
a peripheral circuit configured to perform a read operation and a dummy read operation on the memory block; and
a control logic circuit configured to control the peripheral circuit to perform the read operation and the dummy read operation,
wherein the control logic circuit controls the peripheral circuit to set a discharge slope of a dummy pass voltage applied to the memory block during the dummy read operation to be less than a discharge slope of a pass voltage applied to the memory block during the read operation, and to discharge the dummy pass voltage after applying the dummy pass voltage to the memory block during the dummy read operation based on the set slope.

9. The memory device of claim 8, wherein the control logic circuit controls the peripheral circuit to apply a positive set voltage to bit lines or a source line of the memory block during a dummy pass voltage discharge period in which the dummy pass voltage is discharged in the dummy read operation.

10. The memory device of claim 8, wherein the control logic circuit controls the peripheral circuit to discharge the pass voltage to a ground voltage during a first time in a pass voltage discharge period in which the pass voltage is discharged during the read operation, and to discharge the dummy pass voltage during a second time longer than the first time in a dummy pass voltage discharge period in which the dummy pass voltage is discharged during the dummy read operation.

11. The memory device of claim 10, wherein a potential level of the pass voltage and a potential level of the dummy pass voltage are the same.

12. The memory device of claim 8, wherein the control logic circuit controls the peripheral circuit to perform the dummy read operation in an idle period.

13. A method of operating a memory device, the method comprising:
performing a read operation on a selected memory block; and
performing a dummy read operation on the selected memory block,
wherein the dummy read operation discharges a dummy pass voltage at a first slope after applying the dummy pass voltage to the selected memory block, and the first slope is less than a discharge slope of a pass voltage applied to the memory block during the read operation.

14. The method of claim 13, wherein a read voltage and a pass voltage are applied to the selected memory block, and then the pass voltage is discharged at a second slope greater than the first slope, during the read operation.

15. The method of claim 14, wherein the pass voltage is discharged to a ground voltage during a first time during the read operation, and
the dummy pass voltage is discharged to the ground voltage during a second time longer than the first time during the dummy read operation.

16. The method of claim 13, further comprising:
applying a positive set voltage to bit lines or a source line of the selected memory block while discharging the dummy pass voltage at the first slope.

17. The method of claim 13, wherein the dummy read operation is performed in an idle period.

* * * * *